US011197365B2

(12) United States Patent
Lucero (10) Patent No.: US 11,197,365 B2
(45) Date of Patent: Dec. 7, 2021

(54) MULTILAYER PRINTED CIRCUIT BOARD FOR REDUCING QUANTUM SIGNAL CROSSTALK

(71) Applicant: Google LLC, Mountain View, CA (US)

(72) Inventor: Erik Anthony Lucero, Mountain View, CA (US)

(73) Assignee: Google LLC, Mountain View, CA (US)

(*) Notice: Subject to any disclaimer, the term of this patent is extended or adjusted under 35 U.S.C. 154(b) by 0 days.

(21) Appl. No.: 16/333,118

(22) PCT Filed: Dec. 20, 2016

(86) PCT No.: PCT/US2016/067780
§ 371 (c)(1),
(2) Date: Mar. 13, 2019

(87) PCT Pub. No.: WO2018/052465
PCT Pub. Date: Mar. 22, 2018

(65) Prior Publication Data
US 2019/0215952 A1    Jul. 11, 2019

Related U.S. Application Data

(60) Provisional application No. 62/394,892, filed on Sep. 15, 2016.

(51) Int. Cl.
*H05K 1/00* (2006.01)
*H05K 1/02* (2006.01)
(Continued)

(52) U.S. Cl.
CPC .......... *H05K 1/0218* (2013.01); *G06N 10/00* (2019.01); *H05K 1/0243* (2013.01); *H05K 1/09* (2013.01);
(Continued)

(58) Field of Classification Search
CPC ...... H05K 1/0218; H05K 1/0243; H05K 1/09; H05K 1/115; H05K 1/181; H05K 1/184;
(Continued)

(56) References Cited

U.S. PATENT DOCUMENTS 5,475,606 A  * 12/1995  Muyshondt ..........  H05K 1/0218
174/257
8,158,892 B2 *  4/2012  Goergen  ..............  H05K 1/0216
174/250
(Continued)

FOREIGN PATENT DOCUMENTS

CN         1638074      7/2005
JP         S59-103391   6/1984
(Continued)

OTHER PUBLICATIONS

Amitroncorp.com, "Aluminum PCB: Aluminum Printed Circuit Boards Contain a Thin Layer of Thermally Conductive Dielectric Material that Transfers Heat," Amitron Corp., available as early as Dec. 2011, retrieved on Dec. 18, 2019, URL<Aluminum Printed Circuit Boards Contain a Thin Layer of Thermally Conductive Dielectric Material that Transfers Heat>, 6 pages.
(Continued)

*Primary Examiner* — Pete T Lee
(74) *Attorney, Agent, or Firm* — Fish & Richardson P.C.

(57) ABSTRACT

A printed circuit board includes: multiple electrically insulating laminate sheets laminated together in a stack; a first electrically conductive layer formed from a superconductor material arranged on a first exterior surface of the stack, the first electrically conductive layer including a signal line and a ground plane; a second electrically conductive layer formed from a superconductor material arranged on a second exterior surface of the stack, the second exterior surface opposing the first exterior surface; a third conductive trace between a first electrically insulating laminate sheet of the
(Continued)

stack and a directly adjacent second electrically insulating laminate sheet of the stack; a first via extending through from the signal line through the stack to the third conductive trace, in which the signal line is electrically connected to the third conductive trace through the via.

23 Claims, 3 Drawing Sheets

(51) Int. Cl.
*G06N 10/00* (2019.01)
*H05K 1/18* (2006.01)
*H05K 1/09* (2006.01)
*H05K 1/11* (2006.01)

(52) U.S. Cl.
CPC .............. *H05K 1/115* (2013.01); *H05K 1/181* (2013.01); *H05K 1/184* (2013.01); *H05K 2201/0302* (2013.01); *H05K 2203/049* (2013.01)

(58) Field of Classification Search
CPC ..... H05K 2201/0302; H05K 2203/049; G06N 10/00
See application file for complete search history.

(56) References Cited

U.S. PATENT DOCUMENTS

| | | | |
|---|---|---|---|
| 9,907,156 | B1* | 2/2018 | Anand ................. H05K 1/0216 |
| 2003/0207766 | A1 | 11/2003 | Esteve et al. |
| 2004/0232912 | A1 | 11/2004 | Tsukamoto et al. |
| 2008/0284545 | A1 | 11/2008 | Keefe et al. |
| 2009/0099025 | A1 | 4/2009 | Uchaykin |
| 2010/0026447 | A1 | 2/2010 | Keefe et al. |
| 2012/0135867 | A1* | 5/2012 | Thom ................. H03H 7/0115 505/210 |
| 2012/0302075 | A1* | 11/2012 | Muraoka ................ H05K 1/115 439/78 |
| 2013/0098671 | A1* | 4/2013 | Thurairajaratnam .. H05K 1/024 174/266 |
| 2016/0019468 | A1* | 1/2016 | Bunyk .................... G06F 30/20 505/170 |
| 2019/0215952 | A1 | 7/2019 | Lucero |

FOREIGN PATENT DOCUMENTS

| | | |
|---|---|---|
| JP | H02-027615 | 1/1990 |
| JP | 2005-524980 | 8/2005 |
| WO | WO 2018/052466 | 3/2018 |
| WO | WO 2010/102263 | 9/2019 |

OTHER PUBLICATIONS

CA Office Action in Canadian Application No. 3,036,501, dated Nov. 26, 2019, 4 pages.

Hilbert et al., "A comparison of lossy and superconducting interconnect for computers," IEEE Transactions on Electron Devices, Sep. 1, 1989, 10 pages.
omnicircuitboards.com [online], "Development of Low Temperature PCB," Oct. 2013, retrieved on Nov. 23, 2016, retrieved from URL <http://www.omnicircuitboards.com/blog/development-of-low-temperature-pcbs>, 4 pages.
omnicircuitboards.com [online], "Omni Circuit Boards Produces Working Aluminum Trace Circuit Board for Quantum Computing Applications," Jul. 2013, retrieved on Nov. 23, 2016, retrieved from URL <http://www.omnicircuitboards.com/aluminum-trace-pcb-press-release>, 3 pages.
omnicircuitboards.com [online], "Your Source for Fine-Line Aluminum Printed Circuit Boards: Aluminum printed circuit boards provide the design solution to challenges faced with low temperature superconductive circuit boards and applications where the radiation absorbtion properties of aluminum can be exploited," Sep. 2016, retrieved on Nov. 23, 2016, retrieved from URL <http://www.omnicircuitboards.com/aluminum-circuit-boards>, 3 pages.
omnicircuitboards.com [online], "Aluminum trace PCB design guide," Aug. 2012, Sep. 2016, retrieved on Nov. 11, 2016, retrieved from URL <http://www.omnicircuitboards.com/aluminum-trace-pcb-design-guide>, 5 pages.
PCT International Preliminary Report on Patentability in International Appln No. PCT/US2016/067781, dated Mar. 19, 2019, 9 pages.
PCT International Search Report and Written Opinion in International Appln No. PCT/US2016/067780, dated Mar. 31, 2017, 15 pages.
PCT International Search Report and Written Opinion in International Appln No. PCT/US2016/067781, dated May 30, 2017, 14 pages.
Rigetti et al., "Fully microwave-tunable universal gates in superconducting qubits with linear couplings and fixed transition frequencies", Physical Review, Apr. 2010, 7 pages.
JP Office Action in Japanese Appln. No. 2019-514297, dated Apr. 13, 2020, 8 pages (with English translation).
PCT International Preliminary Report on Patentability in International Appln No. PCT/US2016/067780, dated Dec. 17, 2018, 23 pages.
AU Examination Report in Australian Appln. No. 2016423191, dated Jan. 23, 2020, 3 pages.
AU Notice of Acceptance in Australian Appln. No. 2016423191, dated Aug. 20, 2020, 3 pages.
CA Office Action in Canadian Appln. No. 3,036,501, dated Sep. 4, 2020, 4 pages.
CN Office Action in Chinese Appln. No. 201680089325.9, dated Dec. 3, 2020, 13 pages (with English translation).
JP Notice of Allowance in Japanese Appln. No. 2019-5!4297, dated Aug. 21, 2020, 5 pages (with English translation).
Colless et al., "Cryogenic High-Frequency Readout and Control Platform for Spin Qubits," Review of Scientific Instruments. Feb. 2012. 83:023902.
Office Action in European Appln. No. 16823476.3, dated Aug. 17, 2021, 10 pages.

* cited by examiner

MULTILAYER PRINTED CIRCUIT BOARD FOR REDUCING QUANTUM SIGNAL CROSSTALK

CROSS-REFERENCE TO RELATED APPLICATION

This application is a National Stage Application under 35 U.S.C. § 371 and claims the benefit of International Application No. PCT/US2016/067780, filed Dec. 20, 2016, which claims priority to U.S. Provisional Application No. 62/394,892, filed Sep. 15, 2016. The disclosure of the foregoing applications are hereby incorporated by reference in their entirety.

TECHNICAL FIELD

The present disclosure pertains to multilayer printed circuit boards for reducing quantum signal crosstalk.

BACKGROUND

Quantum computing is a relatively new computing method that takes advantage of quantum effects, such as superposition of basis states and entanglement to perform certain computations more efficiently than a classical digital computer. In contrast to a digital computer, which stores and manipulates information in the form of bits (e.g., a "1" or "0"), quantum computing systems can manipulate information using qubits. A qubit can refer to a quantum device that enables the superposition of multiple states (e.g., data in both the "0" and "1" state) and/or to the superposition of data, itself, in the multiple states. In accordance with conventional terminology, the superposition of a "0" and "1" state in a quantum system may be represented, e.g., as $\alpha|0\rangle + \beta|1\rangle$. The "0" and "1" states of a digital computer are analogous to the $|0\rangle$ and $|1\rangle$ basis states, respectively of a qubit. The value $|\alpha|^2$ represents the probability that a qubit is in $|0\rangle$ state, whereas the value $|\beta|^2$ represents the probability that a qubit is in the $|1\rangle$ basis state.

SUMMARY

In general, in some aspects, the subject matter of the present disclosure can be embodied in devices that include: a printed circuit board having multiple electrically insulating laminate sheets laminated together in a stack, a first electrically conductive layer arranged on a first exterior surface of the stack, the first electrically conductive layer including a first conductive trace and a second conductive trace, a second electrically conductive layer arranged on a second exterior surface of the stack, the second exterior surface opposing the first exterior surface, a third conductive trace between a first electrically insulating laminate sheet of the stack and a directly adjacent second electrically insulating laminate sheet of the stack, a first via extending through from the second conductive trace through the stack to the third conductive trace, in which the second conductive trace is electrically connected to the third conductive trace through the first via; and a chip having a quantum circuit element and a ground contact, in which the quantum circuit element is electrically coupled to the second conductive trace of the printed circuit board, and the ground line is electrically coupled to the first conductive trace.

Implementations of the devices can include one or more of the following features. For example, in some implementations, each of the first conductive trace and the second electrically conductive layer is a superconductor material that exhibits superconducting properties at or below a corresponding critical temperature. The superconductor material may be aluminum. The third conductive trace may be copper. The second conductive trace may be formed from the superconductor material. The first via may include the superconductor material, and the superconductor material in the first via may physically connect the second conductive trace to the third conductive trace.

In some implementations, the printed circuit board includes a second via extending through from the first conductive trace through the stack to the second electrically conductive layer, in which the first conductive trace is electrically connected to the second electrically conductive layer through the second via.

In some implementations, the second conductive trace and the third conductive trace are configured to exhibit a 50 ohm impedance.

In some implementations, the printed circuit board includes a microwave launch connector attached to the stack, in which an outer ground contact of the microwave launch connector is electrically connected to the first conductive trace and to the second electrically conductive layer, and an inner signal contact of the microwave launch connector is electrically connected to the third conductive trace.

In some implementations, the printed circuit board includes more than two electrically insulating laminate sheets.

In some implementations, the quantum circuit element includes a qubit.

In some implementations, the quantum circuit element includes a measurement readout resonator coupled to a qubit.

In general, in some other aspects, the subject matter of the present disclosure can be embodied in devices that include a printed circuit board, the printed circuit boards including: multiple electrically insulating laminate sheets laminated together in a stack; a first ground plane arranged on a first exterior surface of the stack, in which the first ground plane is a first superconductor material; a first electrically conductive signal trace separate from the ground plane on the first exterior surface of the stack; a second ground plane arranged on a second exterior surface of the stack, the second exterior surface opposing the first exterior surface, in which the second ground plane is a second superconductor material; a second electrically conductive signal trace between a first electrically insulating laminate sheet of the stack and a directly adjacent second electrically insulating laminate sheet of the stack; and a first via extending through from the first electrically conductive trace through the stack to the second electrically conductive trace, in which the first electrically conductive trace is electrically connected through the via to the second electrically conductive trace.

Implementations of the devices may include one or more of the following features. For example, in some implementations, the first superconductor material and the second superconductor material are the same material. The first superconductor material and the second superconductor material may be aluminum.

In some implementations, the second electrically conductive signal trace includes copper.

In some implementations, the first electrically conductive signal trace includes the first superconductor material. The first via may include the first superconductor material in which the superconductor material in the first via physically and electrically connects the first electrically conductive trace to the second electrically conductive trace. In some implementations, the first superconductor material is aluminum.

In some implementations, the devices include a second via extending through from the first ground plane through the stack to the second ground plane, in which the first ground plane is electrically connected to the second ground plane through the second via.

In some implementations, the first electrically conductive signal trace and the second electrically conductive signal trace are configured to exhibit a 50 ohm impedance.

In some implementations, the devices include a microwave launch connector attached to the stack, in which an outer ground contact of the microwave launch connector is electrically connected to the first ground plane and to the second ground plane, and an inner signal contact of the microwave launch connector is electrically connected to the second electrically conductive signal trace.

In some implementations, the printed circuit board includes more than two electrically insulating laminate sheets.

Implementations may include one or more of the following advantages. For example, in some implementations, by using a superconductor material as the conductor for the ground lines, settling times of control signals sent to qubit devices can be substantially reduced when the multilayer printed circuit board is operated below the critical temperature of the superconductor material. In some implementations, providing the control/measurement lines (or a substantial portion of the control/measurement lines) within a layer that is separated from the ground lines can reduce the crosstalk between those signal lines.

For the purposes of this disclosure, a superconductor (or superconducting) material includes a material that exhibits superconducting properties at or below a corresponding superconducting critical temperature.

The details of one or more implementations are set forth in the accompanying drawings and the description below. Other features and advantages will be apparent from the description, the drawings, and the claims.

DETAILED DESCRIPTION

During operation of a quantum processor, such as a superconductor quantum annealer, the frequency of a qubit may be dynamically adjusted by supplying a control signal to the qubit. Typically, the control signal may be provided to a chip containing the qubit in which the control signal is in the form of a square wave or square pulse from a printed circuit board. Additionally, measurements of the qubit state may be coupled from the chip containing the qubit to the printed circuit board, after which the measured signals may be converted from analog to digital form for analysis.

Typically, the conductive lines comprising the control and ground lines on the printed circuit board may be patterned in the form of coplanar waveguides. That is, a control signal/measurement signal travels along a center conductive line of material on the surface of the printed circuit board, and two conductive lines providing ground connections extend along either side of the center conductive line, while being separated from the center conductive line by a gap of constant width. The ground lines are formed on the same surface as the center conductive line. However, the use of coplanar waveguide transmission lines may, in some implementations, lead to substantial crosstalk. For example, the field lines from a first voltage signal on a first control line may extend and interfere with a second voltage signal on a second control line. This interference may reduce the integrity of the control signals being provided to qubits and/or the measurement signals being read from qubit readout devices.

Furthermore, metals such as copper, which are typically used as the conductor for printed circuit boards, retain a low resistance when cooled to the superconductor critical temperatures at which a superconductor quantum processor may be operated. This small but residual resistance increases the settling time constant of control signals provided to a qubit, resulting in time constants that may be greater than 10 microseconds.

The present disclosure covers systems, devices and structures for quantum processors in which both the signal crosstalk and the settling time may be reduced. For instance, a multilayer printed circuit board may be provided in which the control signal/measurement signal lines are arranged as one or more internal layers of the printed circuit board, whereas the ground lines are arranged as external layers of the printed circuit board. With such a configuration, crosstalk between different control/measurement lines may, in certain implementations, be substantially reduced. In some implementations, the ground lines are formed from a material capable of achieving superconductivity, rather than a conductor that cannot achieve superconductivity. As a result, when the multilayer board is operated at temperatures below the critical temperature of the superconductor material, the ground lines do not exhibit internal resistance, thus allowing a substantial reduction in control signal settling times.

Figure 1A:
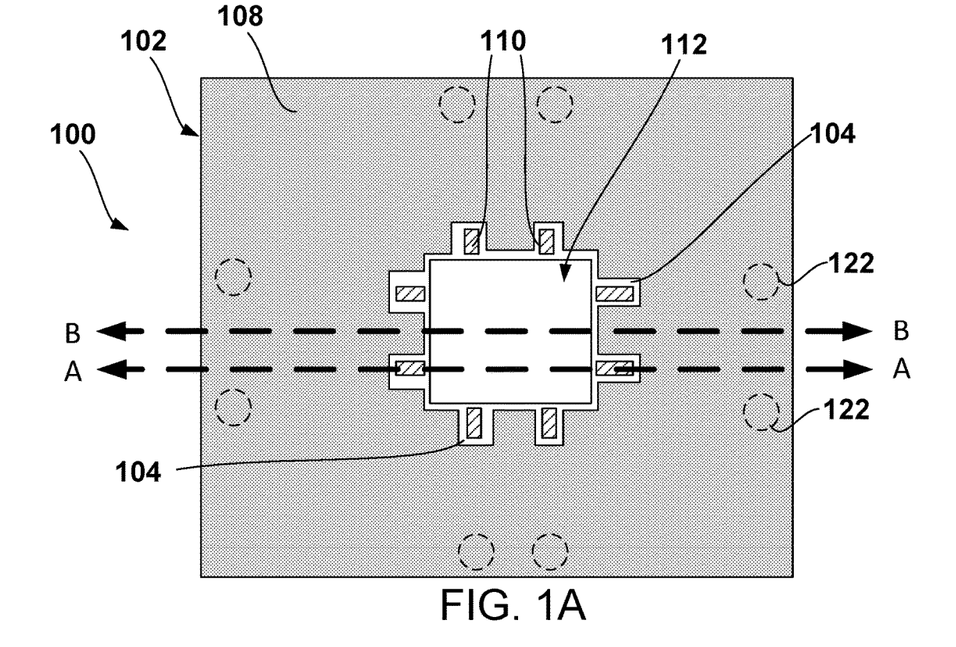
FIGS. 1A-1C are illustrates of example multilayer printed circuit board according to the present disclosure.
Figure 1B:
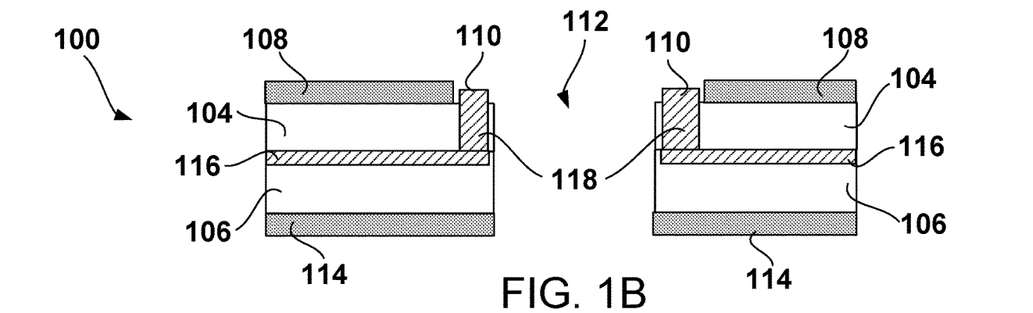
Figure 1C:
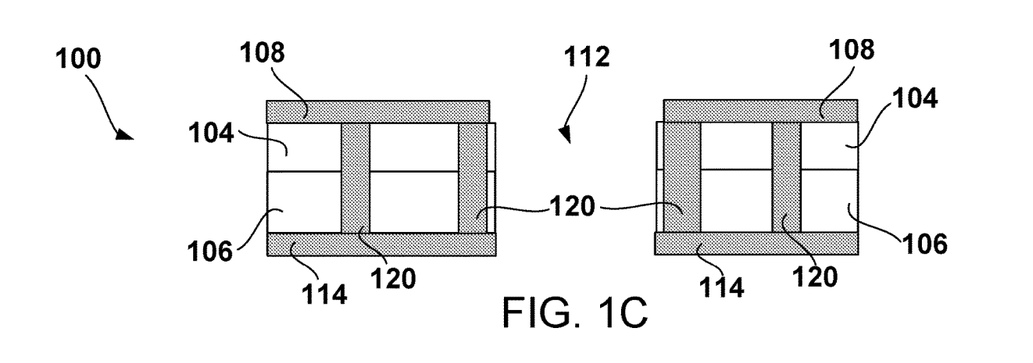

FIG. 1 is a schematic that illustrates an example multilayer printed circuit board 100 according to the present disclosure. FIG. 1A is a schematic illustrating a top view of the printed circuit board 100, whereas FIGS. 1B and 1C are cross-section views through lines A-A and B-B of FIG. 1A, respectively. As shown in FIG. 1A, the device 100 includes a first electrically conductive layer 102. The first electrically conductive layer 102 may be arranged on an exterior surface of a stack of multiple electrically insulating laminate sheets. In the present example, the stack includes two sheets: a first electrically insulating laminate sheet 104 and a second electrically insulating laminate sheet 106, though additional insulating laminate sheets may be included in the stack. The first electrically conductive layer 102 includes a first conductive trace 108 and second conductive traces 110. The first conductive trace 108 may be a ground plane that connected to a power supply ground terminal and serves as a return path for current from different circuit components. The second conductive trace 110 may be a signal path over which a control signal and/or measurement signal may propagate. The first conductive trace 108 and the second conductive trace 110 may be defined so that they do not come into contact with one another. For example, as shown in FIG. 1A, the second conductive traces 110 may be separated from the conductive trace 108 by a gap that exposes a surface of the first electrically insulating laminate sheet 104.

In the example device 100, the second conductive traces 110 are arranged about an opening 112 that extends through the stack of electrically insulating laminate sheets. The opening 112 may be provided as a place in which a chip containing quantum circuit devices (also referred to as quantum circuit elements or quantum devices) may be placed. When placed in the opening 112, the chip containing the quantum circuit devices may be coupled to the electrically conductive layer 102. For example, a ground connection from the chip may be electrically coupled to the first conductive trace 108 serving as the ground plane, and a quantum device from the chip may be electrically coupled to the second conductive trace 110. For instance, the quantum device may include a qubit, and a control terminal of the qubit may be electrically coupled to the second conductive trace 110. Alternatively, the quantum device may include a measurement resonator coupled to a qubit, and an output port of the measurement resonator may be electrically coupled to the second conductive trace 110.

As shown in FIGS. 1B-1C, the device 100 may include a second electrically conductive layer 114 on a second exterior surface of the stack of electrically insulating laminate sheets. The second electrically conductive layer 114 may also be provided as a ground plane. The second exterior surface may be opposite to the first exterior surface of the stack such that the ground plane is on both the top and bottom surfaces of the stack.

The device 100 also includes a third conductive trace 116 that may be between the first electrically insulating laminate sheet 104 and the second electrically insulating laminate sheet 106. The third conductive trace 116 may be electrically connected to the second conductive trace 110 through a via 118 (see FIG. 1B). Via 118 includes an opening filled with electrically conductive material that extends from the exterior surface of the first electrically insulating laminate sheet 104 to the trace 116 at the interface between the first electrically insulating laminate sheet 104 and the second electrically insulating laminate sheet 106. Third conductive trace 116 may be formed on either the bottom side of sheet 104 or the top side of sheet 106 before the sheets are laminated together. Upon lamination of sheet 104 to sheet 106, the resin from each sheet surrounding conductive trace 16 bonds together sealing the area around trace 116.

The device 100 also includes additional vias 120. Each via 120 includes a corresponding opening filled with electrically conductive material that extends from the exterior surface of the first electrically insulating laminate sheet 104 to the exterior surface of the second electrically insulating laminate sheet 106, such that the first conductive trace 108 (forming the first ground plane) is electrically connected to the second electrically conductive layer 114 (forming the second ground plane). The vias 118 and 120 may be formed, e.g., by drilling a hole through the laminate sheet and then filling the vias 118 and 120 with an electrically conductive material. The vias 118 and 120 may have a diameter between about 1 mil and about 20 mils, including for example a diameter of about 12 mils. In some implementations, the device 100 includes multiple vias 120 extending from the first conductive trace 108 to the second electrically conductive layer 114. The multiple vias 120 may be spaced apart from one another by a predetermined distance. For instance, the vias 120 may have a pitch of 25 mils. In some implementations, the vias 120 are laterally separated from adjacent conductive traces 116 by a fixed amount, such as between about 5 and about 10 mils, including for example about 7 mils. The pitch between conductive traces 116 may also be predetermined. For example, the pitch between traces 116 may be between about 20 mils and about 50 mils, including for example about 34 mils.

The electrically insulating laminate sheets 104, 106 may include, but are not limited to, materials used to form printed circuit boards such as paper or cloths impregnated with resin/epoxy, such as FR-1, FR-2, FR-3, FR-4, FR-5, FR-6, G-10, G-11, CEM-1, CEM-2, CEM-3, CEM-4, CEM-5, AD-1000, 45 Nk, 55 NK, or 85 NK.

Other example laminate sheets that may be used as the substrate 114 include polytetrafluoroethylene (PTFE), RF-35 and polyimide. The insulating laminate sheet may have different thicknesses. For example, the insulating laminate sheet may have a thickness between about 1-2 mils (about 25-50 microns) to about several hundred mils. In a particular example, the insulating laminate sheets each have a thickness of about 25 mils. During fabrication of the device 100, the laminate sheets may, e.g., be placed in a press where they are subjected to heating and pressure that fully cures the resin and tightly bonds the sheets together so the sheets maintain adhesion to one another. Via holes may be drilled into the sheets before or after lamination.

To achieve substantially flat and fast settling times for signals (e.g., control pulses) transmitted to quantum circuit devices from the printed circuit board 100, a superconducting material is provided as the material constituting at least the ground planes. For example, the first conductive trace 108, the second electrically conductive layer 114, and the material within vias 120 are formed from a superconductor material that exhibits superconducting properties at or below a corresponding superconducting critical temperature. The superconducting material may include, for example, aluminum, niobium or titanium nitride.

The material constituting the second conductive trace 110, the third conductive trace 116, and the via 118 may include an electrically conductive material that is either capable of superconductivity or that cannot provide superconductivity. For example, the second conductive trace 110, the third conductive trace 116 and the via 118 may include copper. Alternatively, the second conductive trace 110, the third conductive trace 116 and the via 118 may include, e.g., aluminum. Alternatively, in some implementations, the second conductive trace 110 and the material within via 118 are formed from a superconductor material, such as aluminum, whereas the third conductive trace may be formed from a non-superconductor, such as copper. The conductive traces may have a thickness in the range of, e.g., about 1-10 mils (about 25-250 microns). In some implementations, the ground planes are thicker and/or cover a wider area than the conductive traces forming the signal lines. For instance, the first conductive trace 108 and the second electrically conductive layer 114 may cover substantially all of the exterior surfaces on which they are formed, whereas the second conductive trace 110 and the third conductive trace 116 may have widths that are relatively narrow in comparison to the trace 108 and layer 114. For instance, the second conductive trace 110 and the third conductive trace 116 may have widths between 1 and 10 mils, such as 8 mils. In some implementations, the conductive traces of the device 100 may be designed to exhibit a predetermined characteristic impedance (e.g., a 50 ohm impedance) that is suitable to achieve an acceptable signal loss and power handling.

The arrangement of the conductive layers and insulators of device 100 provide a hybrid structure, in which the signal lines from a chip containing quantum devices are initially coupled to a co-planar waveguide structure (see, e.g., the second conductive traces 110 surrounding the opening region 112, with the ground plane 108 extending on either side of the traces 110 by a constant gap width), but then transition to a vertical configuration, in which the signal lines (provided by third conductive trace 116) are bounded on the top and bottom by insulating layers 104, 106 and ground planes 108, 114. This vertical configuration helps to reduce, in certain implementations, cross-talk, since the electrical field lines extending from each signal line tend to terminate only at the ground planes, and generally do not overlap with adjacent signal lines. This is possible even though the co-planar waveguide arrangement is still used near the opening region 112 given that the length of the second conductive trace 110 is relatively short in comparison to the overall length that a signal travels along the third conductive trace 116. For example, the length of the second conductive trace 110 may be between about 5 mils to about 50 mils, such as about 25 mils, whereas the third conductive trace extends much further from the via 118 to near the edge of the device 100 (e.g., at least hundreds of mils).

The conductive traces 116 are formed at the interface between the first and second insulating laminate sheets 104, 106 and extend from the vias 118 to the outer perimeter of the device 100 (e.g., to near the edge of device 100), where the traces 116 may be coupled to microwave connectors (e.g., microwave launchers) at connection ports 122. The microwave connectors may be used to couple signals from conductive traces 116 to coaxial cables or from coaxial cables to the conductive traces 116.

Figure 2:
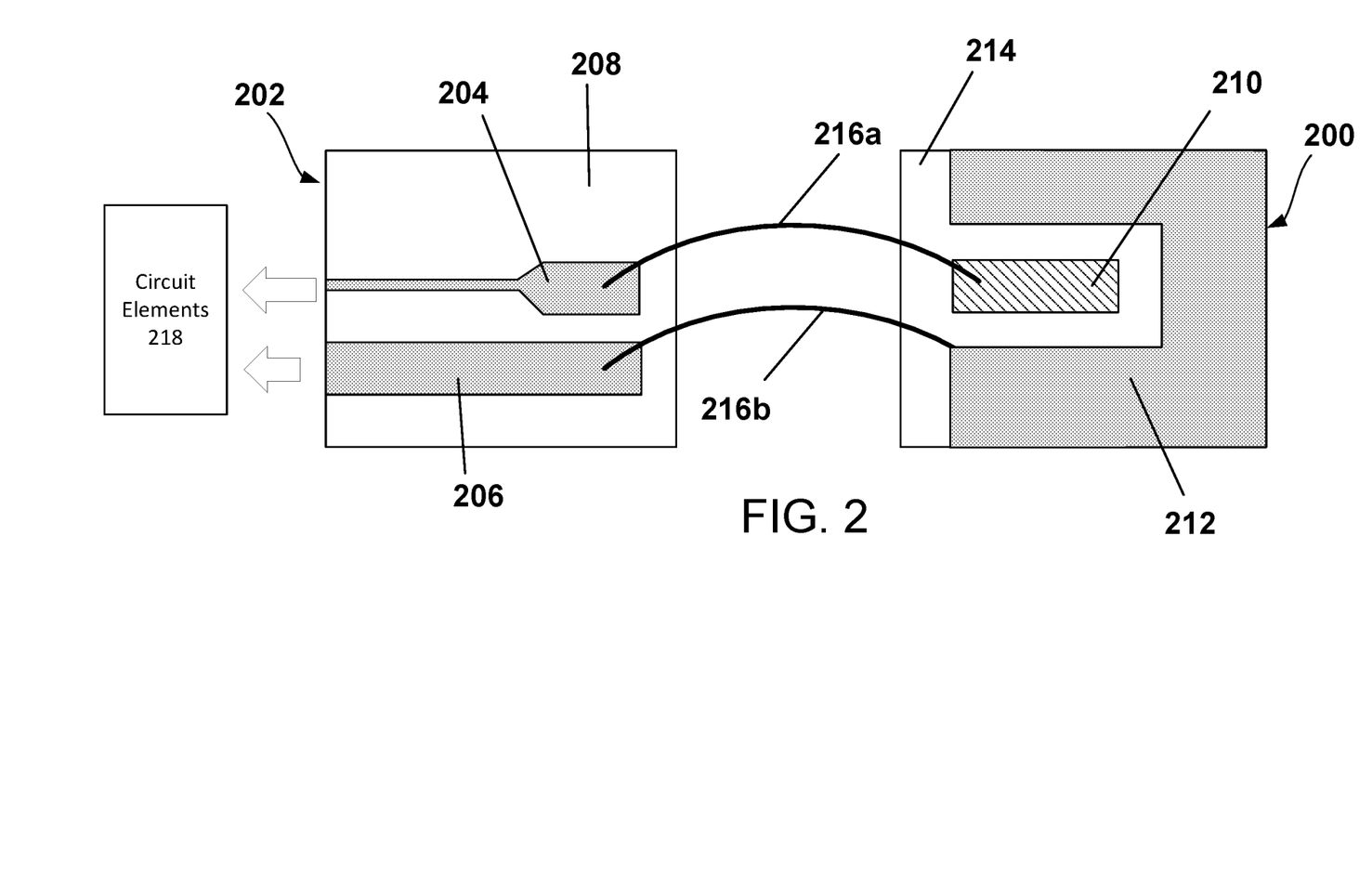
FIG. 2 is an illustration of a top view of an example of a chip that is coupled to a printed circuit board.

As explained herein, the opening region 112 may be provided for positioning a chip containing quantum circuit devices. The quantum circuit devices and ground connections of the chip may be electrically coupled to the conductive traces and ground planes, respectively, of the device 100. FIG. 2 is a schematic illustrating a top view of an example of a chip 202 that is coupled to a printed circuit board 200, such as device 100. For ease of viewing, only a portion of chip 202 and device 200 are illustrated. Chip 202 includes a substrate 208 on which one or more electrically conductive layers are formed. In the example shown in FIG. 2, an electrically conductive layer formed on substrate 208 includes one or more signal lines 204 and one or more ground lines 206. Substrate 208 includes a dielectric substrate, such as, e.g., single crystal silicon or sapphire. The signal line 204 and ground line 206 are formed on the substrate 208 from a thin film superconductor material (or materials) that exhibits superconducting properties when cooled at or below a corresponding superconductor critical temperature. For example, the signal line 204 and ground line 206 may be formed from aluminum, titanium nitride or niobium, among others. The electrically conductive layer may be formed in a thin film such as, e.g., between several nanometers in thickness to several microns in thickness. In some implementations, the signal line 204 and ground line 206 are formed from a single thin film layer of superconductor material that is in direct contact with a surface of the substrate 208. Although the signal line 204 is shown as a single integral component in the figures, the signal line 204 may be constructed, e.g., as a co-planar waveguide having a center trace line separated in a single plane on either side by a ground plane/line.

The signal line 204 and ground line 206 from chip 202 are coupled to the signal line 210 and ground plane 212, respectively, on printed circuit board 200. In some implementations, the signal and ground lines 204, 206 are coupled to signal and ground lines 210, 212, respectively, using coupling elements 216 (e.g., wire bonds). For example, signal line 204 may be electrically coupled to signal line 210 using wire bond 216a, whereas ground line 206 may be electrically coupled to ground plane 212 using wire bond 216b. The coupling elements 216 may be formed from superconducting materials, such as aluminum wire bonds. In some implementations, ultrasonic wire bonding may be used to remove oxides (e.g., native oxides) present on the signal lines, ground lines and/or wire bond material to improve the electrical connection.

Chip 202 includes one or more superconductor circuit elements 218 formed on or within a substrate 208. For ease of viewing, the superconductor circuit elements 218 are illustrated separately from substrate 208 but are understood as being formed on or within substrate 208. The signal line 204 and the ground line 206 may be electrically, capacitively and/or inductively coupled to one or more of the superconductor circuit elements 218 of chip 202. The superconductor circuit elements 218 and the signal and/or ground lines 204, 206 may be part of the same electrically conductive layer formed on the surface of substrate 208.

The superconductor circuit elements 218 may include superconductor quantum circuit elements. Superconductor quantum circuit elements include circuit elements that are configured to make use of quantum-mechanical phenomena, such as superposition and entanglement, to perform operations on data in a non-deterministic manner. In contrast, classical circuit elements generally process data in a deterministic manner. Superconductor quantum circuit elements include quantum circuit elements formed using superconductor materials that exhibit superconducting properties at or below a corresponding superconductor critical temperature. For example, the superconductor quantum circuit elements may include titanium nitride, aluminum, or niobium, among others. Certain quantum circuit elements, such as qubits, may be configured to represent and operate on information in more than one state simultaneously. In some implementations, quantum circuit elements include circuit elements such as superconducting co-planar waveguides, quantum LC oscillators, flux qubits, charge qubits, superconducting quantum interference devices (SQUIDs) (e.g., RF-SQUID or DC-SQUID), among others.

In some implementations, the superconductor circuit elements 218 include superconductor classical circuit elements. As explained herein, classical circuit elements generally process data in a deterministic manner. The superconductor classical circuit elements may be configured to collectively carry out instructions of a computer program by performing basic arithmetical, logical, and/or input/output operations on data, in which the data is represented in analog or digital form. In some implementations, the superconductor classical circuit elements on the chip 202 may be used to transmit data to and/or receive data from the quantum circuit elements on the chip 202 through electrical or electromagnetic connections. Superconductor classical circuit elements include classical circuit elements formed using superconductor materials that exhibit superconducting properties at or below a corresponding superconductor critical temperature, such as aluminum, titanium nitride, or niobium, among others. Examples of superconductor classical circuit elements include rapid single flux quantum (RSFQ) devices. RSFQ is a digital electronics technology that uses superconductor devices, namely Josephson junctions, to process digital signals. In RSFQ logic, information is stored in the form of magnetic flux quanta and transferred in the form of Single Flux Quantum (SFQ) voltage pulses. Josephson junctions are the active elements for RSFQ electronics, just as transistors are the active elements for semiconductor CMOS electronics. RSFQ is one family of superconductor or SFQ logic. Others include, e.g., Reciprocal Quantum Logic (RQL) and ERSFQ, which is an energy-efficient version of RSFQ that does not use bias resistors.

Figure 3:
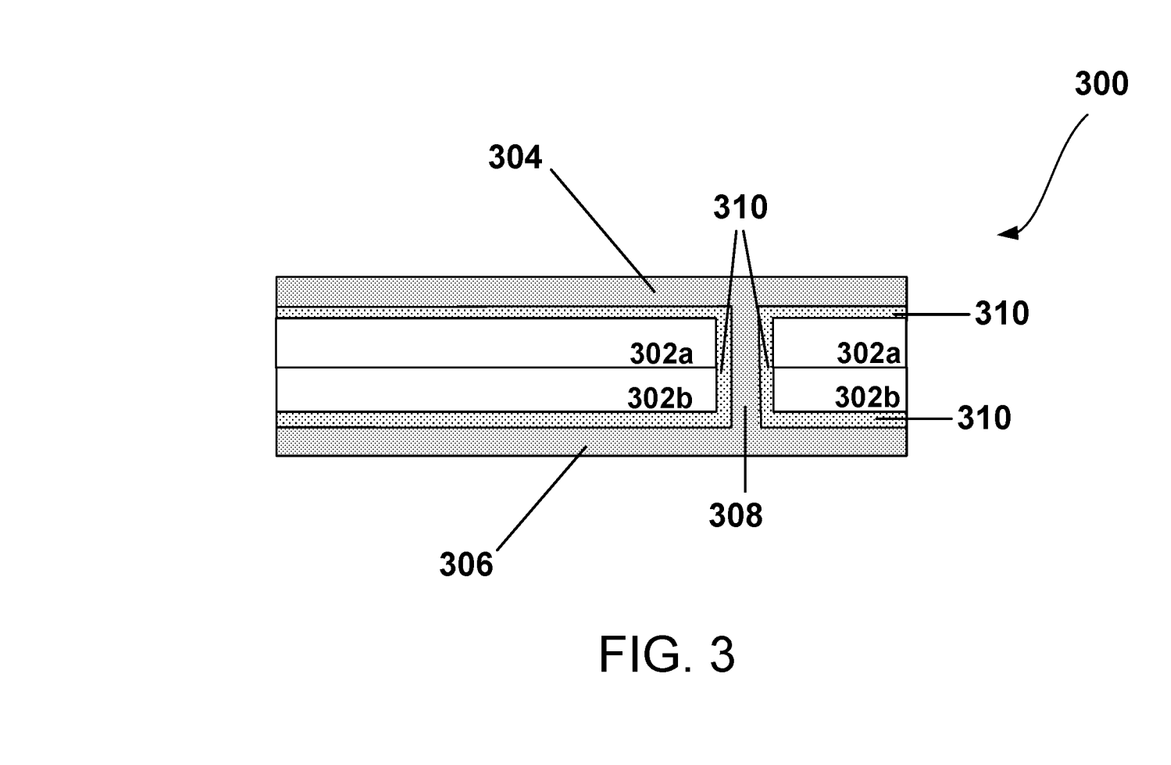
FIG. 3 is an illustration of a cross-section of an example of a printed circuit board.

To aid the adhesion of the superconductor material to the insulating laminate sheets of the printed circuit board, a base layer may be deposited on the board and within the vias followed by deposition of the superconductor material layer on the surface of and in contact with the first layer. FIG. 3 is a schematic illustrating a cross-section of an example of a printed circuit board 300, such as the board 100 shown in FIG. 1. The printed circuit board includes two insulating laminate sheets 302a, 302b, such as the sheets 104, 106 shown in FIG. 1, that are laminated together. A conductive trace (not shown in FIG. 3) may be formed at the interface between the two sheets. A first electrically conductive layer 304 formed of a superconductor material may be located on a top side of the sheet 302a and a second electrically conductive layer 306 formed of a superconductor material may be located on a bottom side of the sheet 302b. The first and second electrically conductive layers 304, 306 may be formed from the same or different superconductor material, such as aluminum, titanium nitride, or niobium, among others. The first and second electrically conductive layers 304, 306 are electrically connected together by a via interconnect 308 that extends through a via in the insulating laminate sheets 302a, 302b.

In the example shown in FIG. 3, the first and second electrically conductive layers 304, 306, as well as the via interconnect 308 are formed on and in contact with the surface of a base layer 310. The base layer 310 may include, e.g., an electrically conductive metal that provides adhesion for the superconductor material of the first and second electrically conductive layers 304, 306 as well as for the superconductor material that forms the via interconnect 308. For example, in some implementations, the base layer 310 may be formed from copper. The copper may be deposited, e.g., by electroplating and then patterned to match the outline of the trace wires (e.g., signal lines and ground lines) of the printed circuit board 300. The thickness of the base layer 310 may vary and includes thicknesses between about 5 microns to about 50 microns (e.g., about 25 microns or about 35 microns). Following plating and patterning of the copper, the superconductor material that forms the layers 304, 306 and via interconnect 308 may be formed on the surface of and in contact with base layer 310. For example, in some implementations, aluminum may be electroplated on the surface of the base layer 310 and then patterned to match the outline of the trace wires (e.g., signal lines and ground lines). In some implementations, the electroplating fills the space remaining in the vias that is not filled by the base layer 310.

As explained herein, the conductive traces providing the signal/measurement lines may extend to near the perimeter of the printed circuit board where the conductive traces connect to microwave couplers. The microwave couplers may include, e.g., coaxial connectors including standard types (e.g., BMA or BNC connectors), miniature types (e.g., miniature BNC connectors), sub-miniature types (e.g., SMA or SMC connectors), and micro-miniature types (e.g., IMP, MMCX, MMS, or MMT connectors). Other microwave couplers may be used instead. In some implementations, the ground portion of the connector couples to the ground planes of the board (e.g., the ground planes 108, 114 in FIG. 1), whereas the signal portion of the connector couples to the signal lines of the board (e.g., conductive trace 116 in FIG. 1). The coupling may be a direct electrical connection. For instance, the ground portion of the coupler may extend through an opening in the laminate sheets, in which the opening is filled with solder to electrically connect the two ground planes to the ground portion of the coupler. Similarly, the signal portion of the coupler may extend through a different opening in the laminate sheets that exposes a portion of the conductive trace 116, in which the opening is filled with solder to electrically connect the signal portion of the coupler to the conductive trace 116.

The example board illustrated in FIG. 1 shows only two insulating laminate sheets. However, more than two insulating laminate sheets may be used. For instance, three, four, five or more insulating laminate sheets may be laminated together to form the stack. At the interface between each adjacent pair of insulating laminate sheets, a conductive trace, similar to conductive trace 116 may be formed. Vias may be formed that extend from the exterior surface of a topmost insulating laminate sheet to the different conductive traces formed at the different interfaces between the insulating laminate sheets. As in FIG. 1, the vias electrically connect a conductive trace on the surface of the stack to conductive traces formed at the interfaces between the laminate sheets. An advantage of forming the conductive traces at the different interfaces of a stack containing three or more insulating laminate sheets is that it may allow, in some implementations, an increase in the density of signal lines, since not all signal lines will need to be formed in the same plane (such as is the case in the configuration shown in FIG. 1).

Implementations of the quantum subject matter and quantum operations described in this specification can be implemented in suitable quantum circuitry or, more generally, quantum computational systems, including the structures disclosed in this specification and their structural equivalents, or in combinations of one or more of them. The term "quantum computational systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements may be used to perform quantum processing operations. That is, the quantum circuit elements may be configured to make use of quantum-mechanical phenomena, such as superposition and entanglement, to perform operations on data in a non-deterministic manner. Certain quantum circuit elements, such as qubits, may be configured to represent and operate on information in more than one state simultaneously. Examples of superconducting quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DC-SQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form. In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computational system that uses superconducting quantum circuit elements and/or superconducting classical circuit elements, such as the circuit elements described herein, the superconducting circuit elements are cooled down within a cryostat to temperatures that allow a superconductor material to exhibit superconducting properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

A number of implementations have been described. Nevertheless, it will be understood that various modifications may be made without departing from the spirit and scope of the invention. Accordingly, other implementations are within the scope of the following claims.

What is claimed is:
1. A device comprising:
a printed circuit board comprising
a plurality of electrically insulating laminate sheets laminated together in a stack,
a first electrically conductive layer arranged on a first exterior surface of the stack, the first electrically conductive layer comprising a first conductive trace and a second conductive trace,
a second electrically conductive layer arranged on a second exterior surface of the stack, the second exterior surface opposing the first exterior surface,
a third conductive trace between a first electrically insulating laminate sheet of the stack and a directly adjacent second electrically insulating laminate sheet of the stack,
a first via contact extending through from the second conductive trace through the stack to the third conductive trace, wherein the first via contact electrically connects the second conductive trace to the third conductive trace, wherein the first via contact comprises a superconductor material, and the superconductor material in the first via contact physically connects the second conductive trace to the third conductive trace; and
a chip comprising a quantum circuit element and a ground contact, wherein the quantum circuit element is electrically coupled to the second conductive trace of the printed circuit board, and the ground contact is electrically coupled to the first conductive trace.

2. The device of claim 1, wherein each of the first conductive trace and the second electrically conductive layer is formed from the superconductor material.

3. The device of claim 2, wherein the superconductor material is aluminum.

4. The device of claim 2, wherein the third conductive trace is copper.

5. The device of claim 4, wherein the second conductive trace is formed from the superconductor material.

6. The device of claim 1, wherein the printed circuit board comprises a second via contact extending through from the first conductive trace through the stack to the second electrically conductive layer, wherein the second via contact electrically connects the first conductive trace to the second electrically conductive layer.

7. The device of claim 1, wherein the printed circuit board comprises more than two electrically insulating laminate sheets.

8. The device of claim 1, wherein the quantum circuit element comprises a qubit.

9. The device of claim 1, wherein the quantum circuit element comprises a measurement readout resonator coupled to a qubit.

10. A device comprising a printed circuit board, the printed circuit board comprising:
a plurality of electrically insulating laminate sheets laminated together in a stack;
a first ground plane arranged on a first exterior surface of the stack, wherein the first ground plane is a first superconductor material;
a first electrically conductive signal trace separate from the first ground plane on the first exterior surface of the stack;
a second ground plane arranged on a second exterior surface of the stack, the second exterior surface opposing the first exterior surface, wherein the second ground plane is a second superconductor material;
a second electrically conductive signal trace between a first electrically insulating laminate sheet of the stack and a directly adjacent second electrically insulating laminate sheet of the stack; and
a first via contact extending through from the first electrically signal conductive trace through the stack to the second electrically conductive trace, wherein the first via contact electrically connects the first electrically conductive trace to the second electrically conductive signal trace.

11. The device of claim 10, wherein the first superconductor material and the second superconductor material are the same material.

12. The device of claim 11, wherein the first superconductor material and the second superconductor material are aluminum.

13. The device of claim 10, wherein the second electrically conductive signal trace comprises copper.

14. The device of claim 13, wherein the first electrically conductive signal trace comprises the first superconductor material.

15. The device of claim 14, wherein the first via contact comprises the first superconductor material that physically connects the first electrically conductive signal trace to the second electrically conductive signal trace.

16. The device of claim 15, wherein the first superconductor material is aluminum.

17. The device of claim 16, comprising a second via contact extending through from the first ground plane through the stack to the second ground plane, wherein the second via contact electrically connects the first ground plane to the second ground plane.

18. The device of claim 10, wherein the printed circuit board comprises more than two electrically insulating laminate sheets.

19. A device comprising:
a printed circuit board comprising
a plurality of electrically insulating laminate sheets laminated together in a stack,
a first electrically conductive layer arranged on a first exterior surface of the stack, the first electrically conductive layer comprising a first conductive trace and a second conductive trace,
a second electrically conductive layer arranged on a second exterior surface of the stack, the second exterior surface opposing the first exterior surface,
a third conductive trace between a first electrically insulating laminate sheet of the stack and a directly adjacent second electrically insulating laminate sheet of the stack,
a first via contact extending through from the second conductive trace through the stack to the third conductive trace, wherein the first via contact electrically connects the second conductive trace to the third conductive trace; and
a chip comprising a quantum circuit element and a ground contact, wherein the quantum circuit element is electrically coupled to the second conductive trace of the printed circuit board, and the ground contact is electrically coupled to the first conductive trace, and wherein the second conductive trace and the third conductive trace are configured to exhibit a 50 ohm impedance.

20. A device comprising:
a printed circuit board comprising
a plurality of electrically insulating laminate sheets laminated together in a stack,
a first electrically conductive layer arranged on a first exterior surface of the stack, the first electrically conductive layer comprising a first conductive trace and a second conductive trace,
a second electrically conductive layer arranged on a second exterior surface of the stack, the second exterior surface opposing the first exterior surface,
a third conductive trace between a first electrically insulating laminate sheet of the stack and a directly adjacent second electrically insulating laminate sheet of the stack,
a first via contact extending through from the second conductive trace through the stack to the third conductive trace, wherein the first via contact electrically connects the second conductive trace to the third conductive trace,
a microwave launch connector; and
a chip comprising a quantum circuit element and a ground contact, wherein the quantum circuit element is electrically coupled to the second conductive trace of the printed circuit board, and the ground contact is electrically coupled to the first conductive trace,
wherein the microwave launch connector is attached to the stack, wherein an outer ground contact of the microwave launch connector is electrically connected to the first conductive trace and to the second electrically conductive layer, and an inner signal contact of the microwave launch connector is electrically connected to the third conductive trace.

21. A device comprising a printed circuit board, the printed circuit board comprising:
a plurality of electrically insulating laminate sheets laminated together in a stack;
a first ground plane arranged on a first exterior surface of the stack, wherein the first ground plane is a first superconductor material;
a first electrically conductive signal trace separate from the first ground plane on the first exterior surface of the stack;
a second ground plane arranged on a second exterior surface of the stack, the second exterior surface opposing the first exterior surface, wherein the second ground plane is a second superconductor material;
a second electrically conductive signal trace between a first electrically insulating laminate sheet of the stack and a directly adjacent second electrically insulating laminate sheet of the stack; and
a first via contact extending through from the first electrically conductive signal trace through the stack to the second electrically conductive signal trace, wherein the first via contact electrically connects the first electrically conductive trace to the second electrically conductive trace, and wherein the first electrically conductive signal trace and the second electrically conductive signal trace are configured to exhibit a 50 ohm impedance.

22. A device comprising a printed circuit board, the printed circuit board comprising:
a plurality of electrically insulating laminate sheets laminated together in a stack;
a first ground plane arranged on a first exterior surface of the stack, wherein the first ground plane is a first superconductor material;
a first electrically conductive signal trace separate from the first ground plane on the first exterior surface of the stack;
a second ground plane arranged on a second exterior surface of the stack, the second exterior surface opposing the first exterior surface, wherein the second ground plane is a second superconductor material;
a second electrically conductive signal trace between a first electrically insulating laminate sheet of the stack and a directly adjacent second electrically insulating laminate sheet of the stack;

a first via contact extending through from the first electrically conductive signal trace through the stack to the second electrically conductive signal trace, wherein the first via contact electrically connects the first electrically conductive trace to the second electrically conductive trace; and a microwave launch connector attached to the stack, wherein an outer ground contact of the microwave launch connector is electrically connected to the first ground plane and to the second ground plane, and an inner signal contact of the microwave launch connector is electrically connected to the second electrically conductive signal trace.

23. The device of claim 10, wherein the first superconductor material is in a superconducting state when a material comprising the second electrically conductive signal trace is in a non-superconducting state.

\* \* \* \* \*